United States Patent [19]

Kobayashi

[11] Patent Number: 5,295,114
[45] Date of Patent: Mar. 15, 1994

[54] SEMICONDUCTOR MEMORY DEVICE WITH REDUNDANT CIRCUIT FOR RESCUING FROM REJECTION DUE TO LARGE CURRENT CONSUMPTION

[75] Inventor: Yasuo Kobayashi, Tokyo, Japan

[73] Assignee: NEC Corporation, Tokyo, Japan

[21] Appl. No.: 792,623

[22] Filed: Nov. 15, 1991

[30] Foreign Application Priority Data

Nov. 16, 1990 [JP] Japan .................................. 2-312044

[51] Int. Cl.$^5$ .............................................. G11C 29/00
[52] U.S. Cl. ................................. 365/230.06; 365/200
[58] Field of Search ................. 365/230.06, 200, 225.7

[56] References Cited

U.S. PATENT DOCUMENTS

| | | | |
|---|---|---|---|
| 4,768,168 | 8/1988 | Watanabe | 365/230.06 X |
| 4,837,747 | 6/1989 | Dosaka et al. | 365/230.06 X |
| 4,916,336 | 4/1990 | Houston | 365/230.06 X |
| 4,953,127 | 8/1990 | Hagahashi et al. | 365/230.06 X |
| 4,987,560 | 1/1991 | Hamano et al. | 365/230.06 X |

FOREIGN PATENT DOCUMENTS

| | | |
|---|---|---|
| 0359204 | 3/1990 | European Pat. Off. . |
| 2576133 | 7/1986 | France . |
| 9012401 | 10/1990 | World Int. Prop. O. . |

Primary Examiner—Eugene R. LaRoche
Assistant Examiner—Do Hyun Yoo
Attorney, Agent, or Firm—Sughrue, Mion, Zinn, Macpeak & Seas

[57] ABSTRACT

A semiconductor memory device has regular memory cells arranged in rows and columns, and at least one of the rows is replaced with redundant memory cells when one of the regular memory cells in the row is defective, wherein a fuse element is broken for isolating a power supply line associated with the row from a main power supply line so that a defective memory cell does not consume any current, thereby improving the power consumption of the semiconductor memory device.

6 Claims, 8 Drawing Sheets

SEMICONDUCTOR MEMORY DEVICE WITH REDUNDANT CIRCUIT FOR RESCUING FROM REJECTION DUE TO LARGE CURRENT CONSUMPTION

FIELD OF THE INVENTION

This invention relates to a semiconductor memory device and, more particularly, to a redundant circuit for rescuing the semiconductor memory device from rejection due to large current consumption.

DESCRIPTION OF THE RELATED ART

Miniaturization of circuit components promotes the ultra-large scaled integration, and semiconductor memory devices presently available exceed 1 megabits. However, the miniaturized circuit components are affectable by turbulences of fabrication process such as, for example, attack of a micro-dust, and a defective circuit component causes the semiconductor memory device to be rejected as an inferior product. In order to rescue the semiconductor memory device with the defective circuit component from the rejection, a redundant technology is applied to the semiconductor memory device, and improves the production yield of the semiconductor memory device.

FIG. 1 shows a typical example of the semiconductor memory device which largely comprises a regular memory cell array 1 and a redundant memory cell array 2. The regular memory cell array 1 is fabricated from a large number of regular memory cells arranged in rows and columns, and only two memory cells are shown and labeled with M1 and Mm, respectively. Word lines WL1 to WLm are coupled with the rows of the regular memory cells, and the word lines WL1 to WLm are selectively driven to an active high voltage level with a row address decoding unit 3. The redundant memory cell aray 2 is fabricated from a small number of redundant memory cells arranged in two rows, and only two redundant memory cells are labeled with RM1 and RM2, respectively. The rows of the redundant memory cells RM1 and RM2 are coupled with redundant word lines RWL1 and RWL2, respectively, and the redundant word lines RWL1 and RWL2 are selectively driven to the active high voltage level by a redundant word line driving unit after replacement of a row of defective regular memory cells with one of the rows of the redundant memory cells. The regular memory cells and the redundant memory cells are of a static type implemented by a flip flop circuit shown in FIG. 2, and the static random access memory cell shown in FIG. 2 comprises two series combinations of resistors R1 and R2 and n-channel enhancement type field effect transistors QN1 and QN2 coupled in parallel between a positive power voltage line Vcc and a ground voltage line GND, and n-channel enhancement type transfer transistors QN3 and QN4 coupled with the drain nodes of the n-channel enhancement type field effect transistors QN1 and QN2, respectively. Since the drain nodes of the n-channel enhancement type field effect transistors QN1 and QN2 are respectively coupled with the gate electrodes of the n-channel enhancement type field effect transistors QN2 and QN1, either n-channel enhancement type field effect transistor QN1 or QN2 provides current path to the ground voltage line, and the n-channel enhancement type field effect transistors QN1 and QN2 maintain a differential voltage between the drain nodes thereof. However, each of the resistors R1 and R2 is extremely high in resistance for restricting current consumption of each memory cell. In fact, the resistors R1 and R2 are formed by non-doped polysilicon strips, and the resistance of each polysilicon strip is of the order of 1 tera-ohms. The n-channel enhancement type transfer transistors QN3 and QN4 are gated by a word line WL, and allows the differential voltage to propagate therethrough to an associated bit line pair.

In order to fabricate the regular memory cells M1 to Mm on a single semiconductor chip SC1, memory cells are formed in a multi-level structure as shown in FIG. 3. Namely, the word lines WL1 and WL2 of polysilicon are formed on extremely thin gate oxide films of the n-channel enhancement type transfer transistors QN3 and QN4, and a first inter-level insulating film OX1 covers the word lines WL1 and WL2. On the first inter-level insulating film OX1 extends the positive power voltage line which is usually formed of polysilicon, polyside or refractory metal silicide. The positive power voltage line Vcc is overlain by a second inter-level insulting film (not shown), and the ground voltage line GND is formed on the second inter-level insulating film in an overlapped manner with the positive power voltage line Vcc. The ground voltage line GND is further covered with a third inter-level insulating film (not shown), and bit lines B1 and B2 of aluminum passing over the third inter-level insulating film. Contact holes C1, C2, C3 and C4 are formed in the first to third inter-level insulating films, and allows the bit lines B1 and B2 to couple with the drain regions of the n-channel enhancement type transfer transistors QN3 and QN4.

Turning back to FIG. 1, bit line pairs are shared between the regular memory cell array 1 and the redundant memory cell array 2, and only one of the bit line pairs is shown and labeled with BLP. The regular memory cells M1 and Mm and the redundant memory cells RM1 and RM2 are coupled with the bit line pair BLP, and a balancing circuit 5 charges and equalizes the bit line pairs at a predetermined level when a balancing signal BL goes down to an active low voltage level. After the balancing, one of the word lines WL1 to WLm, RWL1 and RWL2 is lifted to the active high voltage level, and differential voltage levels stored in the memory cells or the redundant memory cells take place on the bit line pairs. The bit line pairs are coupled with a column selecting unit 6, and a column decoding unit 7 allows one of the bit line pairs to couple with a read/write data bus 8. Therefore, one of the differential voltage levels is transferred from the bit line pair through the column selecting unit 6 to the read/write data bus 8. The read/write data bus 8 is coupled with an input data driver 9 and a data sense amplifier 10, and the differential voltage level indicative of the data bit to be accessed is increased by the data sense amplifier 10. On the other hand, an input data bit in the form of differential voltage is supplied from the input data driver 9 to the read/write data bus 8 which in turn is transferred through the column selecting unit 6, one of the bit line pairs to one of the regular memory cells and the redundant memory cells. Then, the input data bit is memorized therein in the form of differential voltage.

Turning to FIG. 4 of the drawings, the row address decoding unit 3 is illustrated in detail. The row address decoding unit 3 is implemented by a plurality of row address decoding circuits 31 to 3x each provided in association with two of the word lines WL1 to WLm. Each of the row address decoding circuits 31 to 3x largely comprises an activation section 3a and a word line driver section 3b, and the activation section 3a is coupled through a fuse element 3c with a word line driving section 3b. The activation section 3a has a parallel combination of p-channel enhancement type field effect transistors QP11, QP12 and QP13 coupled between the positive power voltage line Vcc and an output node N1, and a series combination of n-channel enhancement type field effect transistors QN14, QN15 and QN16 coupled between the output node N1 and the ground voltage line GND. Predecoded signals are selectively supplied to the row address decoding circuits 31 to 3x, and a set of predecoded signals are supplied in parallel to the p-channel enhancement type field effect transistors Qp11 to Qp13 and to n-channel enhancement type field effect transistors Qn14 to Qn16 of the row address decoding circuit 31. The word line driver section 3b has a p-channel enhancement type charging transistor QP17 coupled between the positive power voltage line Vcc and a control line 3d, and two driver circuits 3e and 3f are coupled in parallel between the positive power voltage line Vcc and the ground voltage line GND. The driver circuit 3e comprises a series combination of p-channel enhancement type field effect transistors QP18 and QP19 coupled between the positive power voltage line Vcc and the associated word line WL1, and a parallel combination of n-channel enhancement type field effect transistors QN20 and QN21 coupled between the associated word line WL1 and the ground voltage line GND. The p-channel enhancement type field effect transistor QP19 and the n-channel enhancement type field effect transistor QN20 are gated by the control line 3d, and the other field effect transistors QP18 and QN21 are supplied with the least significant address bit A0. Similarly, the driver circuit 3f comprises a series combination of p-channel enhancement type field effect transistors QP22 and QP23 coupled between the positive power voltage line Vcc and the associated word line WL2, and a parallel combination of n-channel enhancement type field effect transistors QN24 and QN25 coupled between the associated word line WL2 and the ground voltage line GND. The p-channel enhancement type field effect transistor QP23 and the n-channel enhancement type field effect transistor QN24 are gated by the control line 3d, and the other field effect transistors QP22 and QN25 are supplied with the complementary address bit CA0 of the least significant address bit A0. When all of the predecoded signals are an active high voltage level, the p-channel enhancement type field effect transistors QP11 to QP13 turn off, and all of the n-channel enhancement type field effect transistors turn on to couple the control line 3d with the ground voltage line. Therefore, the p-channel enhancement type field effect transistors QP19 and QP23 of the driver circuits 3e and 3f turn on to partially provide current path between the positive power voltage line Vcc and the associated word lines WL1 and WL2. On the other hand, the n-channel enhancement type field effect transistors QN20 and QN24 turn off with the control line of the ground voltage level, and the activation of the word line is dependent upon the least significant address bit A0. Namely, if the least significant address bit A0 is in the active high voltage level, the p-channel enhancement type field effect transistor Q18 turns off, and the n-channel enhancement type field effect transistor QN21 turns on, thereby causing the word line WL1 to remain in the ground voltage level. However, since the complementary least significant address bit CA0 remains low, and the p-channel enhancement type field effect transistor QP22 turns on, and the n-channel enhancement type field effect transistor QN25 turns off. As a result, the word line WL2 is isolated from the ground voltage line GND, and the current path is completely established from the positive power voltage line Vcc and the word line WL2 for driving to the active high voltage level.

The circuit arrangement of the redundant word line driving unit 4 is shown in FIG. 5. The redundant word line driving unit 4 comprises a complementary inverting circuit 4a coupled between the positive power voltage line Vcc and the ground voltage line GND, and two redundant word line driver circuits 4b and 4c associated with the redundant word line driver circuits RWL1 and RWL2, respectively. The complementary inverting circuit 4a consists of a p-channel enhancement type field effect transistor QP26 and an n-channel enhancement type field effect transistor QN27, and selectively couples a control line 4d with the positive power voltage line Vcc and the ground voltage line GND. The redundant word line driver circuit 4b comprises a series combination of p-channel enhancement type field effect transistors QP28 and QP29 coupled between the positive power voltage line Vcc and the redundant word line RWL1, and a parallel combination of the n-channel enhancement type field effect transistors QN30 and QN31 coupled between the redundant word line RWL1 and the ground voltage line GND. Similarly, the redundant word line driver circuit 4c comprises a series combination of p-channel enhancement type field effect transistors QP32 and QP33 coupled between the positive power voltage line Vcc and the associated redundant word line RWL2, and a parallel combination of n-channel enhancement type field effect transistors QN34 and QN35 coupled between the associated redundant word line RWL2 and the ground voltage line GND. If an external address signal is indicative of the address assigned to one of the rows of defective regular memory cells, a redundant row address decoder (not shown) lifts a signal line 4e to an active high voltage level, and the complementary inverting circuit 4a conducts the control line 4d with the ground voltage line GND. With the ground voltage level on the control line 4d, the p-channel enhancement type field effect transistors QP29 and QP33 turn on, and the n-channel enhancement type field effect transistors QN30 and QN34 turn off. The least significant address bit A0 and the complementary address bit thereof CA0 select one of the redundant word line driver circuits 4b and 4c. Namely, if the least significant address bit A0 is in the active high voltage level, the p-channel enhancement type field effect transistor QP28 isolates the associated redundant word line RWL1 from the positive power voltage line Vcc. However, the complementary address bit CA0 allows the redundant word line RWL2 to go up to the active high voltage level. Thus, the access to a defective memory cell is shifted to an access to a redundant memory cell.

However, if the row address decoding unit 3 drives one of the word lines WL1 to WLm upon access to a defective memory cell replaced with a redundant memory cell, undesirable multiple-selection takes place, and a read-out data bit is never reliable. Therefore, when a defective memory cell due to, for example, a micro-dust in a diffusion stage, deformation of a pattern in a lithography is found in a diagnosis operation, the row address assigned to the defective memory cell is memorized in the redundant row address decoder (not shown) for replacing the adjacent two rows with the defective memory cell with the two rows of the redundant memory cells, and the fuse element 3c of the associated row address decoding circuit is broken with laser beam radiation. After the fuse element 3c is broken, the control line 3d is supplied through the p-channel enhancement type field effect transistor QP17 with the positive power voltage level Vcc at all times, and the n-channel enhancement type field effect transistors QN20 and QN24 are forcibly turned on. The n-channel enhancement type field effect transistors QN20 and QN24 provide current paths from the associated word lines WL1 and WL2 to the ground voltage line GND at all times, and the semiconductor memory device is prevented from any multiple-selection.

Thus, the redundant memory cell array 2 replaced with the rows with defective memory cells rescues the semiconductor memory device, and enhances the production yield. However, a problem is encountered in the prior art semiconductor memory device in that some defective memory cells do not allow the semiconductor memory device to be rescued. In detail, if the positive power voltage line Vcc is conducted with the ground voltage line GND in the vicinity of a regular memory cell, leakage current directly flows into the ground voltage line GND without passing through the series combinations of the resistors R1 and R2 and the n-channel enhancement type field effect transistors QN1 and QN2 (see FIG. 2), and the multi-level structure shown in FIG. 3 is liable to conduct the positive power voltage line Vcc with the ground voltage line GND. The defective memory cell can not memorize any data bit in the form of differential voltage, and is replaced with a redundant memory cell as described hereinbefore. However, the design specification of the semiconductor memory device usually limits current consumption in a standby phase, and the allowable current consumption is of the order of 10 microamperes or the less. If the leakage current flows around the defective memory cell, the semiconductor memory device hardly clears the design specification, and is rejected as an inferior product.

SUMMARY OF THE INVENTION

It is therefore an important object of the present invention to provide a semiconductor memory device which can be rescued from rejection due to large current consumption in the standby phase of operation.

To accomplish these objects, the present invention proposes to isolate a power voltage line associated with a row of regular memory cells from a main power supply line when the row of the regular memory cells is replaced with redundant memory cells.

In accordance with the present invention, there is provided a semiconductor memory device fabricated on a single semiconductor memory chip, comprising: a) a regular memory cell array having a plurality of regular memory cells arranged in rows and columns and respectively storing data bits; b) a plurality of first power voltage lines associated with the rows of the memory cells for distributing a first power voltage level; c) a plurality of second power voltage lines associated with the rows of the memory cells for distributing a second power voltage level different from the first power voltage level; d) a plurality of regular word lines respectively associated with the rows of the regular memory cells, and selectively driven to an active level for allowing data bits to be read out from a row of the regular memory cells; e) a plurality of redundant memory cells respectively storing data bits, and coupled with redundant word lines; f) a redundant word line driving unit selectively driving the redundant word lines to the active level for allowing data bits to be read out from redundant memory cells selected from the plurality of redundant memory cells when one of the plurality of regular memory cells to be accessed is defective; g) a row address decoding means having g-1) a plurality of regular driver circuits respectively associated with the word lines and coupled in parallel between a first source line of the active level and a second source line of an inactive level for selectively coupling the associated regular word lines with the first and second source lines, g-2) a plurality of activation circuits associated with the plurality of regular word lines, and responsive to row address bits for allowing the regular driver circuits to selectively couple the associated regular word lines with the first and second source lines, and g-3) a plurality of first cut-off means associated with the plurality of activation circuits and with the first power voltage lines, and coupled between a main power supply line and the associated first power voltage lines, the first plurality of cut-off means being selectively broken for isolating the associated first power voltage lines from the main power supply line when one of the regular memory cells in the associated rows is defective, the plurality of decoding circuits causing the associated regular driver circuits to forcibly shift the associated regular word lines to the inactive level when the associated first cut-off means are broken; and h) a plurality of bit line pairs associated with the regular memory cell array and the redundant memory cell array, and respectively coupled with the columns of the regular memory cells and the redundant memory cells for propagating the data bits to a column selector unit.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
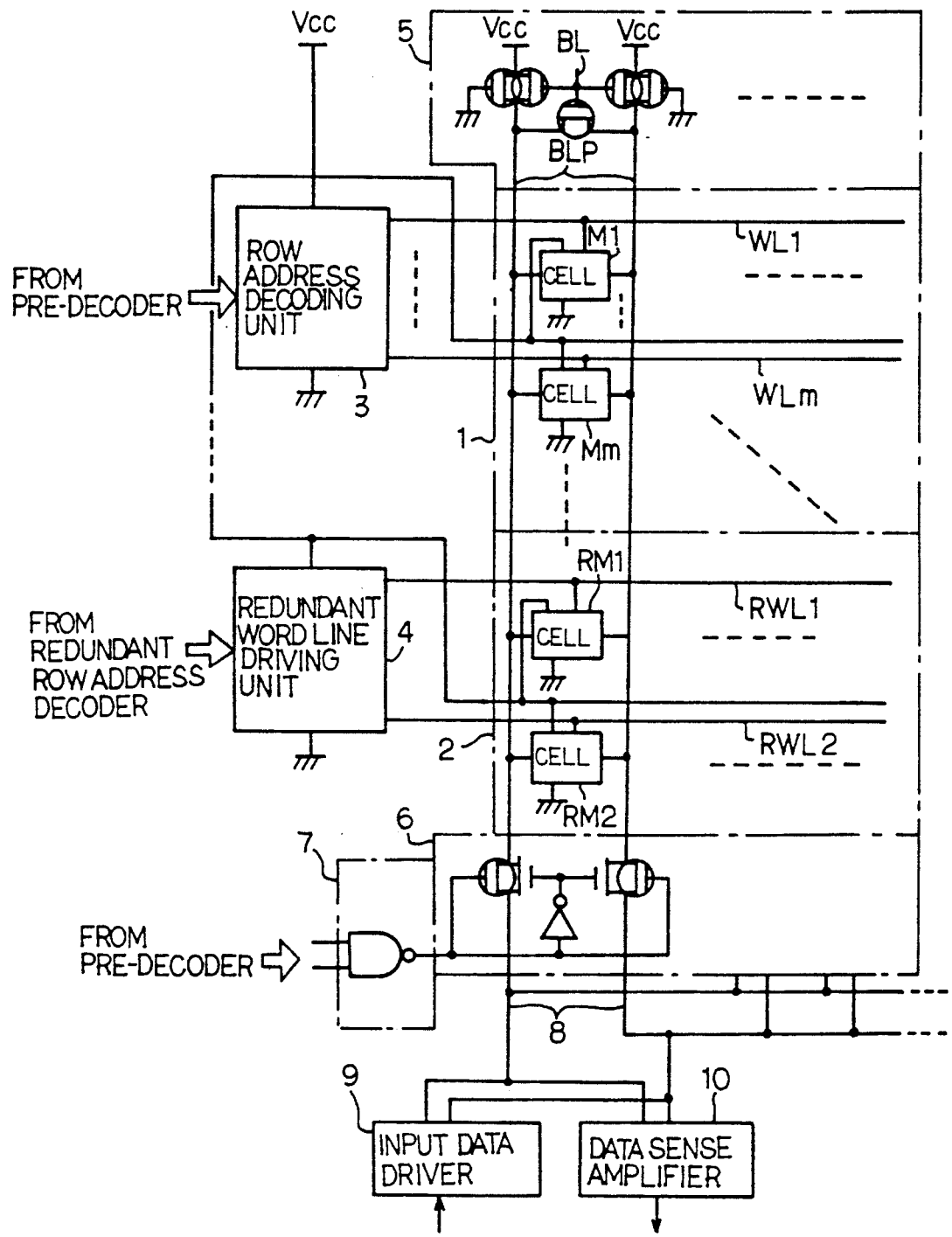
FIG. 1 is a circuit diagram showing the arrangement of the prior art random access memory device with redundant circuit.
Figure 2:
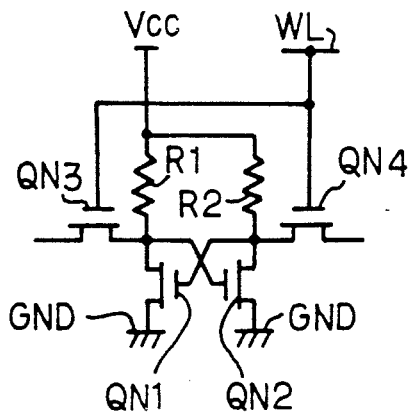
FIG. 2 is a circuit diagram showing the arrangement of the memory cell incorporated in the prior art semiconductor memory device.
Figure 6:
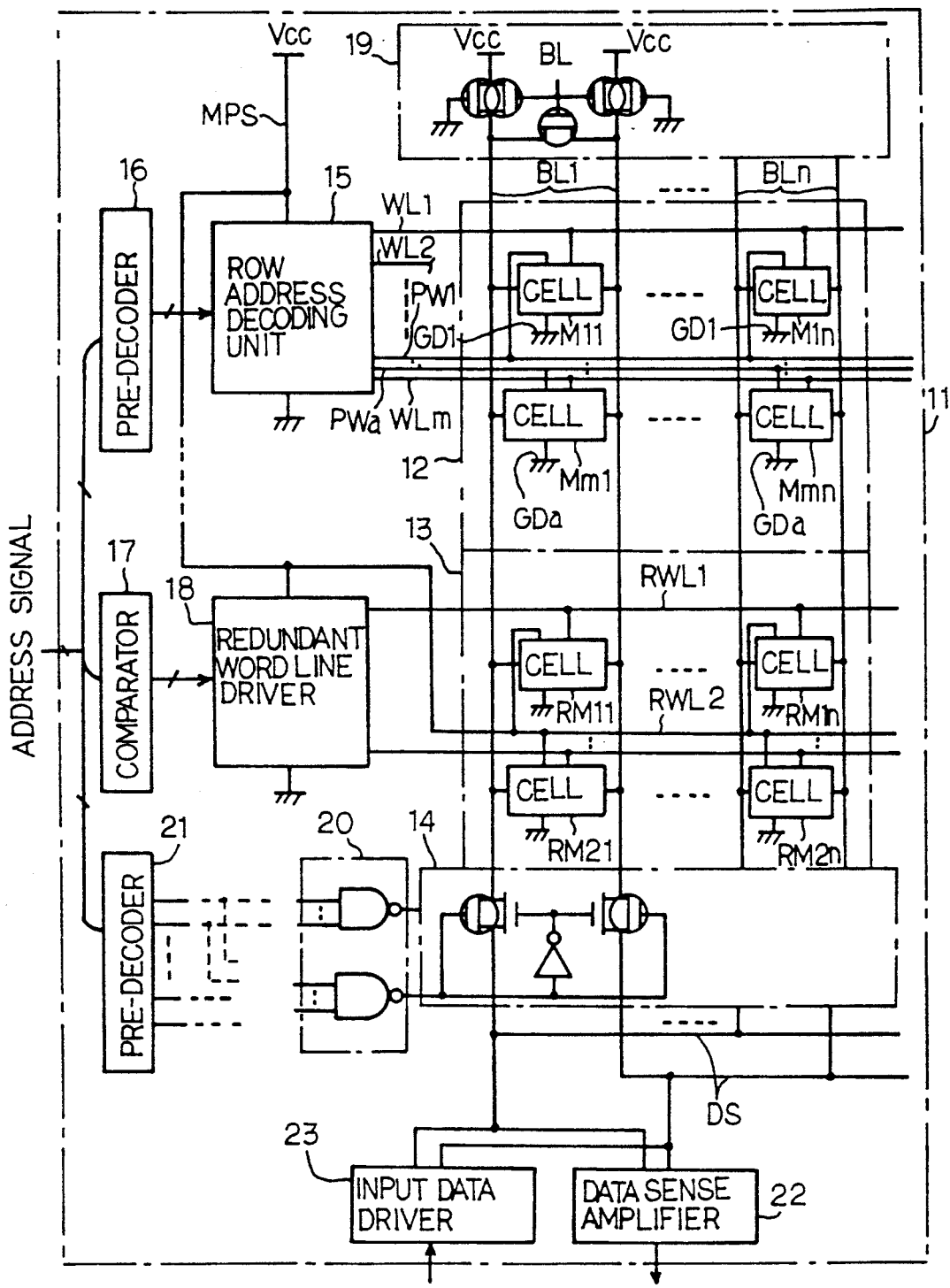
FIG. 6 is a circuit diagram showing the arrangement of a static type random access memory device according to the present invention.

Referring to FIG. 6 of the drawings, a static type random access memory device embodying the present invention is fabricated on a single semiconductor chip 11, and comprises a regular memory cell array 12 implemented by a plurality of regular memory cells M11, M1n, Mm1 and Mmn arranged in rows and columns. The regular memory cells M11 to Mmn are of the static type implemented by the flip flop circuit arranged as shown in FIG. 2. The static type random access memory device further comprises a redundant memory cell array 13, and the redundant memory cell array 13 has a plurality of redundant memory cells RM11, RM1n, RM21 and RM2n arranged in two rows. The redundant memory cells RM11 to RM2n are of the static type similar to the regular memory cell.

Figure 3:
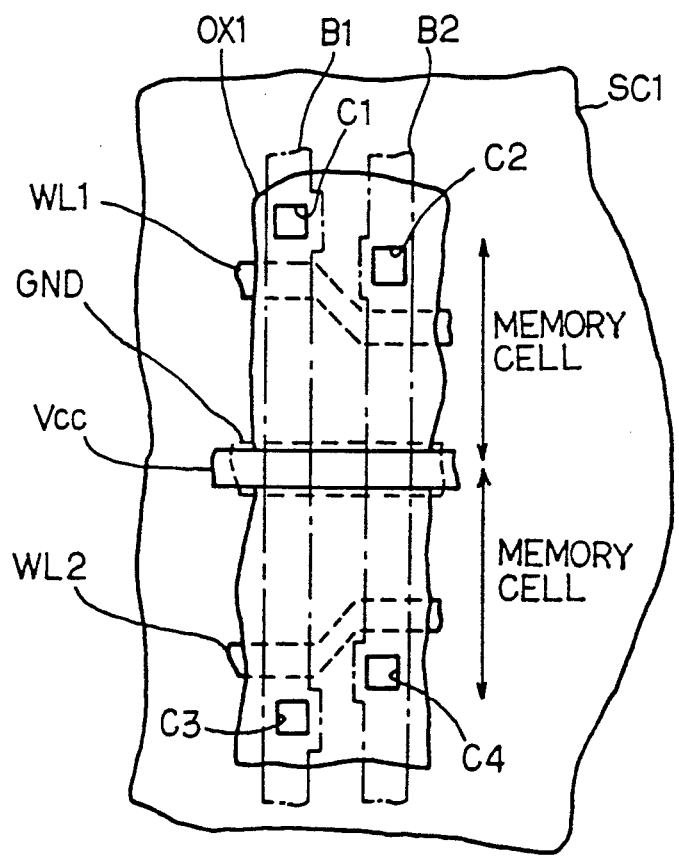
FIG. 3 is a plan view showing the multi-level structure of the memory cells incorporated in the prior art semiconductor memory device.
Figure 4:
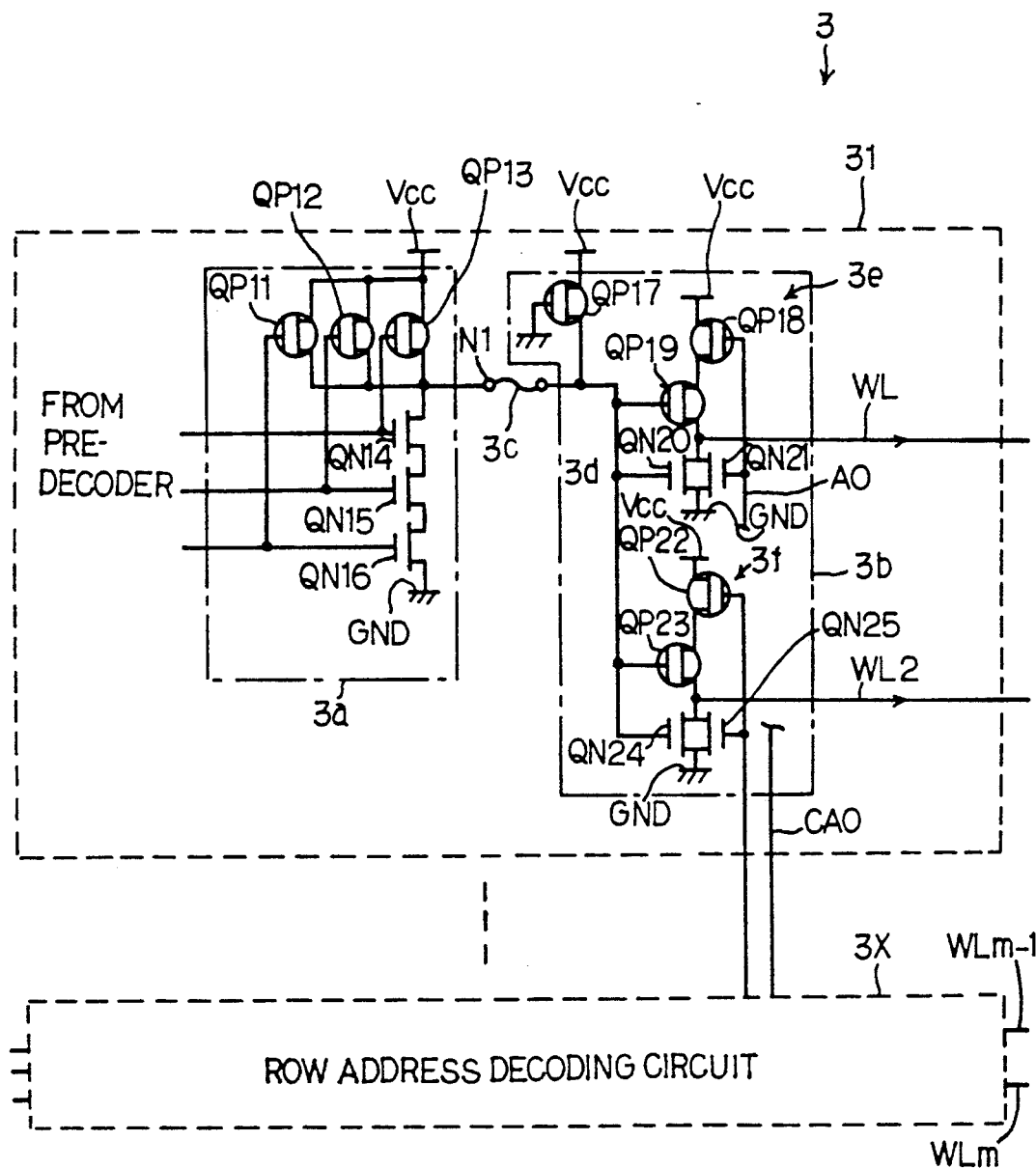
FIG. 4 is a circuit diagram showing the arrangement of the row address decoding unit incorporated in the prior art semiconductor memory device.

A plurality of regular word lines WL1, WL2 and WLm are associated with the regular memory cell array 12, and coupled with the rows of the regular memory cells M11 to Mmn, respectively. The rows of the regular memory cells M11 to Mmn are further associated with positive power voltage lines PW1 to PWa, and each of the positive power voltage lines PW1 to PWa is shared between ever two adjacent rows of the regular memory cells M11 to Mmn. Similarly, ground voltage lines GD1 to GDa are provided for the regular memory cell array 12, and every two adjacent rows of the regular memory cells M11 to Mmn share one of the ground voltage lines GD1 to GDa. This is because of the fact that the associated voltage lines PW1 to PWa and GD1 to GDa are laminated on the regular memory cell array 12 as similar to those shown in FIG. 3. The columns of the regular memory cells M11 to Mmn and the redundant memory cell array 13 are associated with a plurality of bit line pairs BL1 to BLn, and the bit line pairs BL1 to BLn propagate data bits in the form of differential voltage from the regular memory cell array 12 or the redundant memory cell array 13 to a column selecting unit 14 and vice versa. The n-channel enhancement type transfer transistors of the regular memory cells M11 to Mmn are gated by the associated regular word lines WL1 to WLm, and data bits are transferred between the regular memory cells M11 to Mmn and the associated bit line pairs BL1 to BLn. A row address decoding unit 15 is provided for the regular word lines WL1 to WLm, and selectively drives the regular word lines WL1 to WLm to an active high voltage level.

Figure 7:
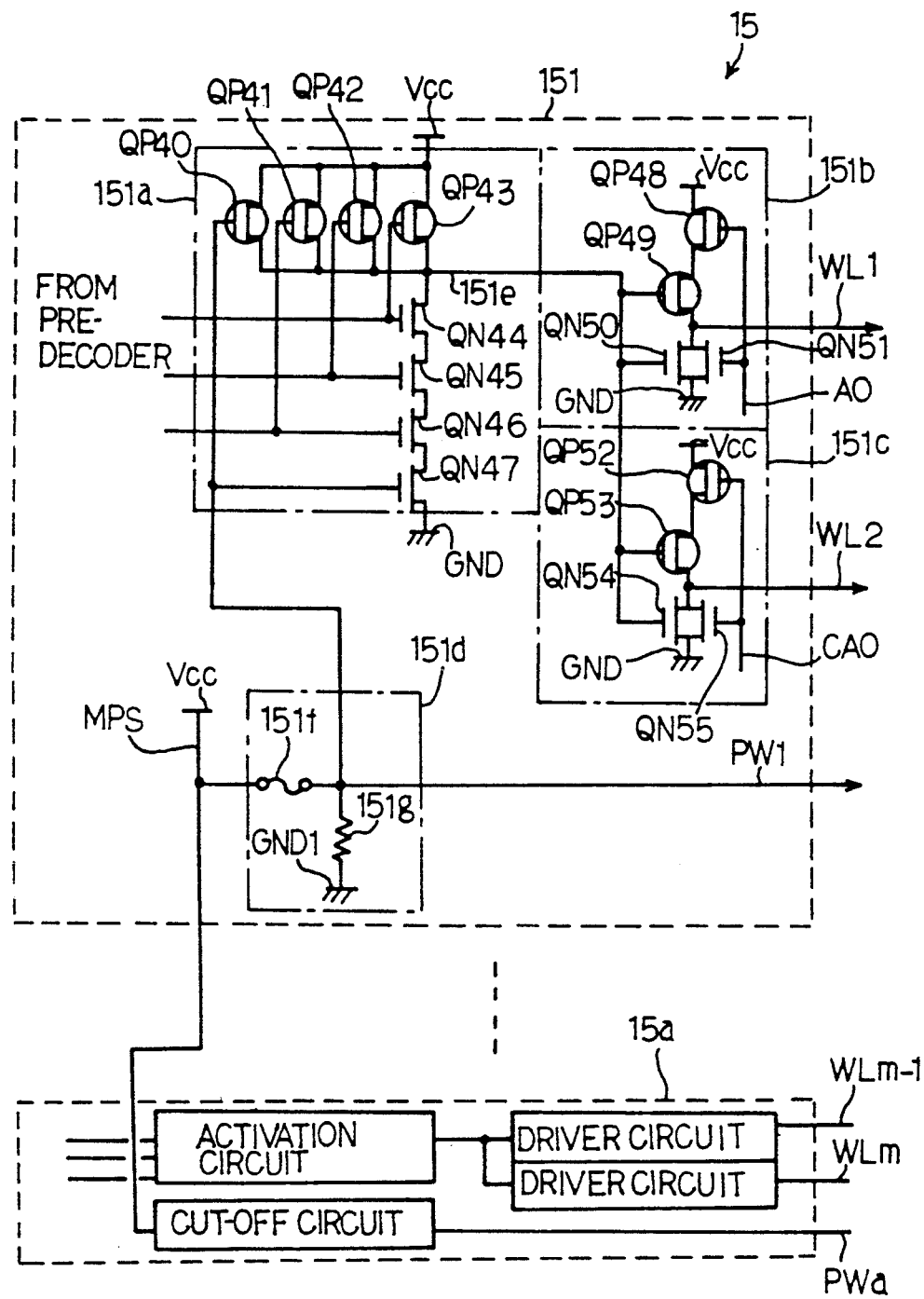
FIG. 7 is a circuit diagram showing the arrangement of a row address decoding unit incorporated in the static type random access memory device shown in FIG. 6.

The row address decoding unit 15 is illustrated in detail in FIG. 7, and comprises a plurality of row address decoding circuits 151 to 15a, and each of the row address decoding circuits 151 to 15a is provided for adjacent two regular word lines. For example, the regular word lines WL1 and WL2 are driven by the row address decoding circuit 151. A predecoder 16 (see FIG. 6) supplies predecoded address bits to the row address decoding unit 15, and one of the row address decoding circuits 151 to 15a is designated by the predecoded address signal except for the least significant bit A0 and the complementary bit CA0 thereof. The row address decoding circuits 151 to 15a are similar in circuit arrangement to one another, and, for this reason, description is made on the row address decoding circuit 151 only.

The row address decoding circuit 151 largely comprises an activation circuit 151a, two driver circuits 151b and 151c, and a cut-off circuit 151d. The activation circuit 151a is responsive to the predecoded address signal except for the least significant bit A0 and the complementary bit CA0 thereof, and activates both of the driver circuits 151b and 151c when the bits of the predecoded address signal designate the row address decoding circuit 151. Namely, the activation circuit 151a comprises a parallel combination of p-channel enhancement type field effect transistors QP40, QP41, QP42 and QP43 coupled between a positive power voltage line Vcc and a control line 151e, and a series combination of n-channel enhancement type field effect transistors QN44, QN45, QN46 and QN47 coupled between the control line 151e and the ground voltage line GND, and the bits of the predecoded address signal are supplied in parallel to the gate electrodes of the p-channel enhancement type field effect transistors QP41 to QP43 as well as to the gate electrodes of the n-channel enhancement type field effect transistors QN44 to QN46. As will be described in connection with the cut-off circuit 151d, the p-channel enhancement type field effect transistor QP40 and the n-channel enhancement type field effect transistor QN47 are respectively turned off and on in so far as no defective memory cell is incorporated in the associated rows of the regular memory cells. If at least one bit of the predecoded address signal is in a low voltage level, the associated p-channel enhancement type field effect transistor QP41, QP42 or QP43 turns on to supply the positive power voltage level to the control line 151e. However, if all of the bits of the predecoded address signal are in a high voltage level, the p-channel enhancement type field effect transistors QP41 to QP43 are turned off, and all of the n-channel enhancement type field effect transistors QN44 to QN46 turn on so that the control line 151e is ground. The ground voltage level on the control line 151e enables the driver circuits 151b and 151c to lift the associated word lines WL1 and WL2. The two driver circuits 151b and 151c are respectively provided for the two word lines WL1 and WL2, and all of the driver circuits of the row address decoding unit 15 are assigned all of the word lines WL1 to WLm.

The driver circuit 151b comprises a series combination of p-channel enhancement type field effect transistors QP48 and QP49 coupled between the positive power voltage line Vcc and the associated word line WL1, and a parallel combination of n-channel enhancement type field effect transistors QN50 and QN51 coupled between the associated word line WL1 and the ground voltage line GND. The gate electrodes of the p-channel enhancement type field effect transistor QP49 and the gate electrode of the n-channel enhancement type field effect transistor QN50 are coupled with the control line 151e, and the least significant bit of the predecoded signal is supplied to the gate electrodes of the p-channel enhancement type field effect transistor QP48 and the gate electrode of the n-channel enhancement type field effect transistor QN51. Similarly, the driver circuit 151c comprises a series combination of p-channel enhancement type field effect transistors QP52 and QP53 coupled between the positive power voltage line Vcc and the associated word line WL2, and a parallel combination of n-channel enhancement type field effect transistors QN54 and QN55 coupled between the associated word line WL2 and the ground voltage line GND. When the driver circuits 151b and 151c are enabled with the ground voltage level on the control line 151e, either driver circuit 151b or 151c lifts the associated word line Owl1 or WL2 to the active high voltage level depending upon the least significant bit. Namely, the least significant bit of the low voltage level causes the p-channel enhancement type field effect transistor QP48 to turn on, and allows the driver circuit 151b to lift the word line WL1 to the active high voltage level. On the other hand, the complementary bit CA0 of the low voltage level switches the p-channel enhancement type field effect transistor QP52, and the driver circuit 151c drives the associated word line WL2 to the active high voltage level. Thus, the driver circuits 151b and 151c selectively charge and discharge the associated word lines WL1 and WL2, and the positive power voltage line Vcc and the ground voltage line GND serve as a first source line of the active level and a second source line of an inactive level, respectively.

The cut-off circuit 151d is coupled between a main power supply line MPS and the associated positive power voltage line PW1 as well as the associated ground voltage line GND1. Though not shown in the drawings, the static type random access memory device has a power supply unit which distributes the positive power voltage level Vcc to the component units and component circuits, and the main power supply line MPS is directly coupled with the power supply unit. The cut-off circuit comprises a fuse element 151f coupled between the main power supply line MPS and the positive power voltage line PW1, and a resistor 151g coupled between the positive voltage line PW1 and the associated ground voltage line GND1. In this instance, the resistor 151g is as large in resistance as 10 giga-ohms, and is implemented by a non-doped polysilicon strip. The non-doped polysilicon strip for the resistor 151g is patterned and formed at the same stage as the resistors R1 and R2 of each regular memory cell, and 10 giga-ohms is feasible in the presently available process sequence. The positive power voltage line PW1 is further coupled with the gate electrode of the p-channel enhancement type field effect transistor QP40 and the gate electrode of the n-channel enhancement type field effect transistor QN47, and, accordingly, the p-channel enhancement type field effect transistor QP40 and the n-channel enhancement type field effect transistor QN47 are complementarily gated by the positive power voltage line PW1. The fuse element 151f is breakable with laser beam radiation in a diagnostic operation after completion of the fabrication. Namely, if one of the regular memory cells coupled with the regular word lines is defective, the manufacturer memorizes the row addresses assigned to the word lines WL1 and WL2 in a comparator 17, and breaks the fuse element 151f with laser beam radiation. Upon destruction of the fuse element 151f, the positive power voltage line PW1 is grounded through the resistor 151g, and the p-channel enhancement type field effect transistor QP40 and the n-channel enhancement type field effect transistor turn on and off, respectively. Therefore, the control line 151e is fixed to the high voltage level, and the driver circuits 151b and 151c are never enabled regardless of the bits of the predecoded signal. Moreover, the positive power voltage line PW1 is forcibly grounded, and any leakage current does not flow between the associated positive voltage line PW1 and the ground voltage line GND1. Thus, the broken fuse element 151f effectively shuts down the power voltage line PW1 associated with the defective memory cells, and most of current in a standby phase is consumed by maintaining the data bits in the regular memory cells M11 to Mmn and the redundant memory cells RM11 to RM2n, if any. In fact, the current consumption of the static random access memory device according to the present invention is, by way of example, about 5 microamperes which is 1,000,000 times as large as the current passing through the resistors R1 and R2 in case of 1 megabit static random access memory device.

Figure 5:
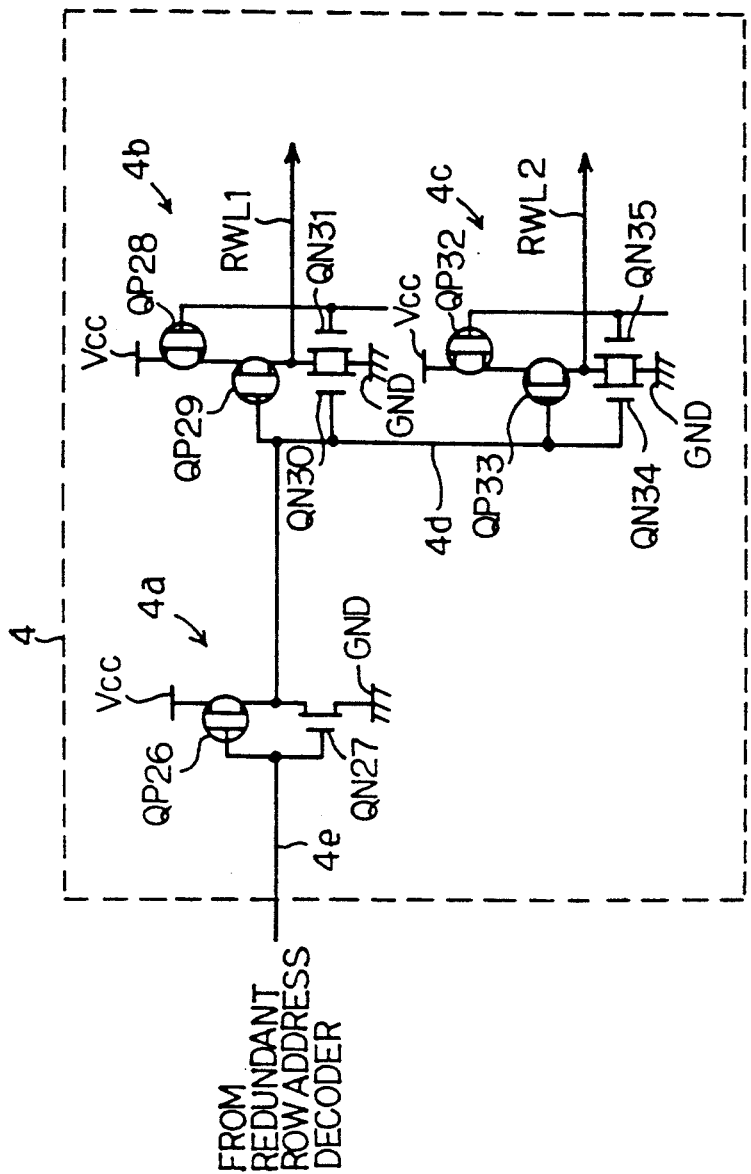
FIG. 5 is a circuit diagram showing the arrangement of the redundant word line driving unit incorporated in the prior art semiconductor memory device.

Turning back to FIG. 6, the static type random access memory device according to the present invention further comprises redundant word lines RWL1 and RWL2 coupled with the rows of the redundant memory cells RM11 to RM2n, respectively, and the redundant word lines WL1 and WL2 are selectively driven to the active high voltage level by a redundant word line driving unit 18. The redundant word line driving unit 18 is similar in circuit arrangement to that of the prior art shown in FIG. 5, and is activated by the comparator 17. As described hereinbefore, the row addresses assigned to the rows replaced with the redundant memory cells RM11 to RM2n are memorized in the comparator 17, and the comparator 17 monitors the row address expressed by an external address signal at all times. If one of the rows replaced with the redundant memory cells is designated by the external address signal, the comparator 17 discriminates and activates the redundant word line driving unit 18 so as to drive either redundant word line RWL1 or RWL2. However, the row address decoding unit 15 never lifts the word line coupled with the defective memory cell, and, accordingly, data bits are read out from the row of redundant memory cells RM11 to RM1n or RM21 to RM2n to the associated bit line pairs BL1 to BLn instead of the row containing the defective memory cell.

The bit line pairs BL1 to BLn are coupled with a charging unit 19, and the charging unit 19 not only supplies current to the bit line pairs BL1 to BLn but also balances the bit line pairs in the presence of a control signal BL. The bit line pairs BL1 to BLn are further terminated at a column selecting unit 14, and a column address decoding unit 20 allows the column selecting unit 14 to couple one of the bit line pairs BL1 to BLn with a data bus DS. Column address bits expressed by the external address signal is firstly supplied to a predecoding unit 21, and predecoded bits are supplied to the column address decoding unit 20. A data sense amplifier 22 and an input data driver 23 are coupled in parallel to the data bus DS, and are communicable with the regular memory cell array 12 and the redundant memory cell array 13.

Circuit behavior is briefly described on the assumption that the defective regular memory cell M11 replaced with the redundant memory cell RM11 is accessed. As described, the fuse element 151f of the row address decoding circuit 151 was broken, and the driver circuits 151b and 151c forcibly kept the word lines WL1 and WL2 low. The external address signal indicative of the regular memory cell M11 is transferred to the predecoding units 16 and 21 as well as the comparator 17, and comparator 17 causes the redundant word line driving unit 18 to lift the redundant word line RWL1 to the active high voltage level. However, the row address decoding unit keeps silent. The charging unit 19 has already balanced the bit line pairs BL1 to BLn in the presence of the control signal BL. Therefore, data bits are read out from the redundant memory cells RM11 to RM1n to the bit line pairs BL1 to BLn, respectively, and differential voltage levels indicative of the data bits take place on the bit line pairs BL1 to BLn, respectively. The pre-decoding unit 21 activates the column address decoding unit 20, and the column address decoding unit 20 causes the column selecting unit 14 to transfer the differential voltage level on the bit line pair BL1 to the data bus DS. The data sense amplifier 22 quickly develop the differential voltage level on the data bus DS, and produces an output data signal.

Prior to a write-in operation, the charging unit 19 balances the bit line pairs BL1 to BLn in response to the control signal BL again. If an input data bit is supplied to the input data driver 23, the input data driver 23 produces a differential voltage level on the data bus, and the column selecting unit 14 transfers the differential voltage level indicative of the input data bit to the bit line pair BL1. Although the row address decoding unit 15 also keeps silent, the redundant word line driving unit 18 lifts the redundant word line RWL1 to the active high voltage level, and the differential voltage level on the bit line pair BL1 is stored in the redundant memory cell RM11.

Second Embodiment

Figure 8:
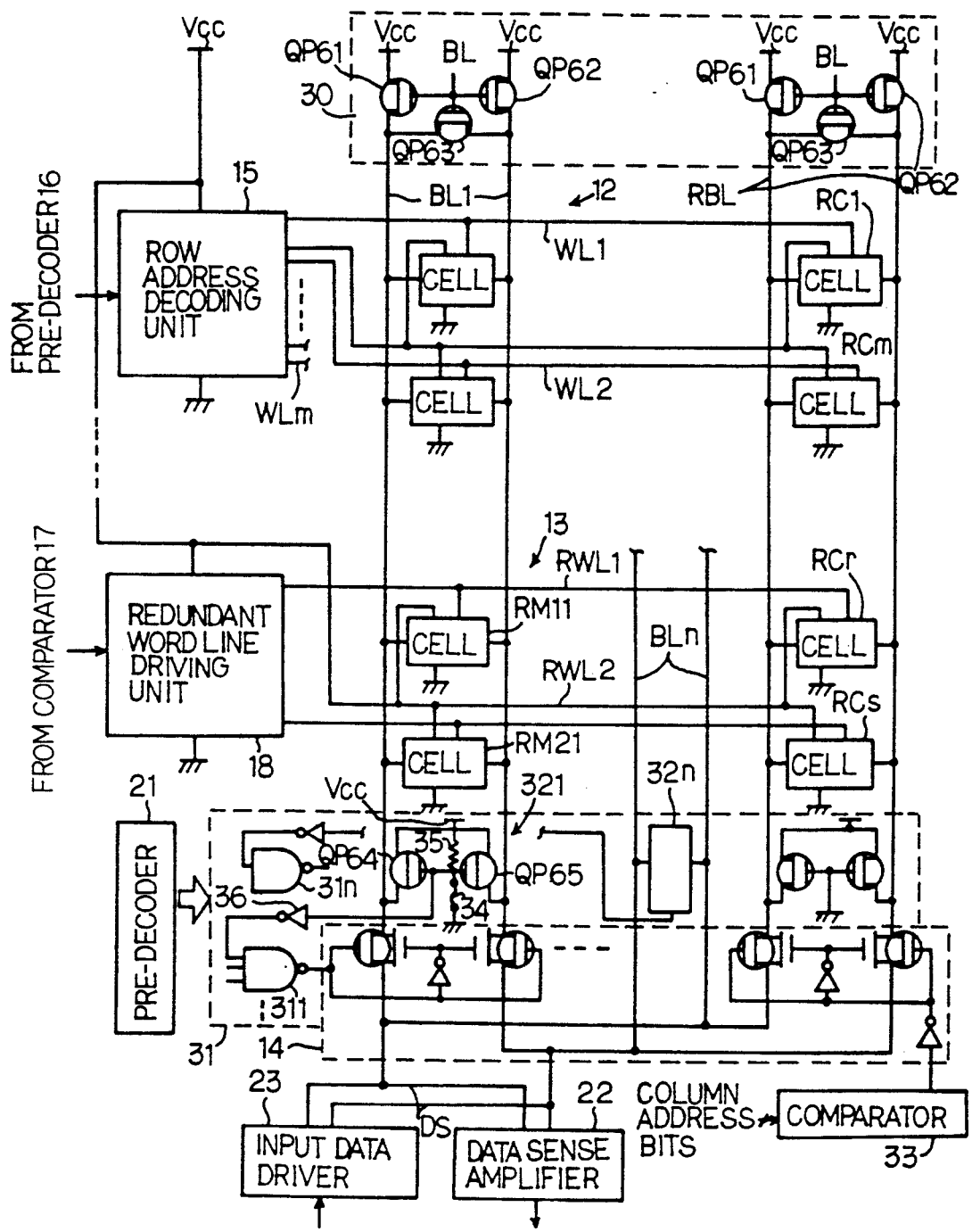
FIG. 8 is a circuit diagram showing the arrangement of another static type random access memory device according to the present invention.

Turning to FIG. 8 of the drawings, another static type random access memory device embodying the present invention is illustrated. A column of redundant memory cells RC1, RCm, RCr and RCs are further incorporated in the static type random access memory device shown in FIG. 8, and other component circuits and units are similar to those of the first embodiment except for a charging unit 30 and a column selecting unit 31. For this reason, the component circuits and units are labeled with the same references designating the corresponding circuits and units of the first embodiment without detailed description.

Each of the redundant memory cells RC1 to RCs is similar in circuit arrangement to the regular memory cell, and is, accordingly, implemented by a flip flop circuit. The column of redundant memory cells RC1 to RCs are respectively gated by the word lines WL1 to WLm and the redundant word lines RWL1 and RWL2, and a data bit is read out from one of the redundant memory cells RC1 to RCs to a redundant bit line pair RBL. The bit line pairs BL1 to BLn as well as the redundant bit line pair RBL are coupled with the charging unit 30, and the charging unit 30 is responsive to a control signal BL so as to supply current to the bit lines BL1 to BLn as well as the redundant bit line pair RBL. Namely, a set of p-channel enhancement type field effect transistors QP61, QP62 and QP63 are provided in association with each of the bit line pairs BL1 to BLn and the redundant bit line pair RBL, and are concurrently gated by the control signal BL. The p-channel enhancement type field effect transistors QP61 and QP62 are coupled in parallel between the positive power voltage line Vcc and the component bit lines of each of the bit line pair BL1 to BLn and the redundant bit line pair RBL, and the p-channel enhancement type field effect transistor QP63 is coupled between the component bit lines. When the control signal BL goes down to the active low voltage level, all of the p-channel enhancement type field effect transistors QP61 to QP63 concurrently turn on to supply current and to balance the component bit lines.

The bit lines BL1 to BLn and the redundant bit line RBL are coupled with the column selecting unit 14, and the column selecting unit 14 is under the control of the column address decoding unit 31. The column address decoding unit 31 has a plurality of driver circuits 311 to 31n respectively associated with the bit line pairs BL1 to BLn, and one of the driver circuits 311 to 31n is activated with the predecoded signal of the pre-decoding unit 21 to allow the column selecting unit 14 to couple the associated bit line pair with the data bus DS. However, the redundant bit line pair RBL is coupled with the data bus DS in the presence of a control signal supplied from a comparator circuit 33. When one of the bit line is short-circuited with one of the word lines WL1 to WLm, RWL1 and RWL2, the associated column of regular memory cells and redundant memory cells is replaced with the column of redundant memory cells RC1 to RCs, because current path is established from the precharging circuit 5 through the short-circuited bit line, the word line and the driver circuit 3e or 3f to the ground voltage line GND. Upon replacement, the manufacturer memorizes a column address assigned to the defective bit line pair in the comparator circuit 33. In this situation, if the external address signal is indicative of the defective bit line pair, the comparator circuit 33 produces the control signal, and the redundant bit line pair RBL is coupled with the data bus DS instead of the defective bit line pair.

In order to prevent the data bus DS from the defective bit line pair, the column address decoding unit 31 further has a plurality of deactivating circuits 321 to 32n respectively associated with the bit line pairs BL1 to BLn, and each of the deactivating circuits 321 to 32n comprises p-channel enhancement type field effect transistors QP64 and QP65 coupled between the positive power voltage line Vcc and the associated bit line pair, The gate electrodes of the p-channel enhancement type field effect transistors QP64 and QP65 are coupled through a breakable fuse element 34 with the ground voltage line GND so that the p-channel enhancement type field effect transistors QP64 and QP65 are turned on to supply current to the associated bit line pair. Although the gate electrodes of the p-channel enhancement type field effect transistors QP64 and QP65 is coupled through a resistor 35 with the positive power voltage line Vcc, the resistor 35 is as large in resistance as 10 giga-ohms, and the gate electrodes of the p-channel enhancement type field effect transistors QP64 and QP65 are kept around the ground voltage level. The gate electrodes of the p-channel enhancement type field effect transistors QP64 and QP65 are coupled through an inverting circuit 36 with one of the input nodes of the associated driver circuit 311 or 31n, and the associated driver circuit is disenabled by the disenabling circuit 321 or 32n. Namely, when the defective bit line pair is replaced with the redundant bit line pair RBL, the manufacturer breaks the fuse element 34, and the p-channel enhancement type field effect transistors QP64 and QP65 are turned off with the positive power voltage level Vcc supplied through the resistor 35. The p-channel enhancement type field effect transistors QP64 and QP65 never supply current to the associated bit line pair, and the inverting circuit 36 disenables the associated driver circuit regardless of the predecoded signal supplied from the predecoding unit 21. Thus, the column address decoding unit 31 not only completes the replacement with the redundant bit line pair RB1 but also cuts off current to the defective bit line pair. As a result, the static type random access memory device implementing the second embodiment is rescued from rejection due to large current consumption due to the short-circuit between a bit line pair and a word line.

Third Embodiment

Figure 9:
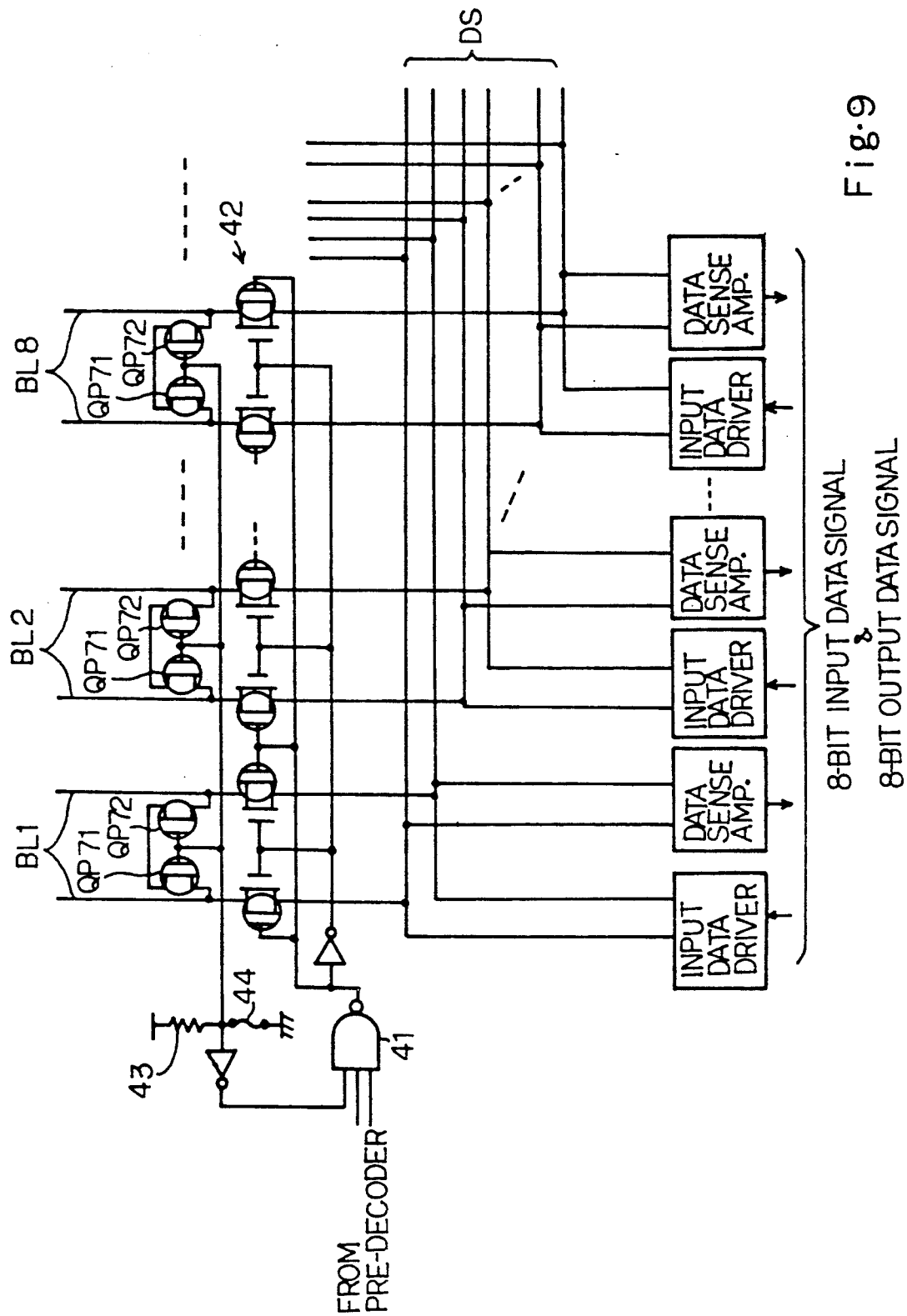
FIG. 9 is a circuit diagram showing the arrangement of yet another static type random access memory device according to the present invention.

Turning to FIG. 9 of the drawings, yet another static type random access memory device embodying the present invention is responsive to an eight-bit input data signal, and can supply an eight-bit output data signal. Therefore, every eight bit line pairs BL1 to BL8 are grouped, and are simultaneously coupled with the data bus DS. In this instance, every driver circuit 41 controls eight transfer gates 42 associated with the eight bit line pairs BL1 to BL8. Although eight pairs of p-channel enhancement type field effect transistors QP71 and QP72 are provided for the eight bit line pairs BL1 to BL8 for supplying current, a single fuse element 43 and a single resistor 44 are provided for the driver circuit 41, and the eight pairs of p-channel enhancement type field effect transistors QP71 and QP72 are simultaneously turned off upon breaking the fuse element. The decoder circuit 41 is also deactivated with the broken fuse element 44, and the number of component elements of the column address decoding unit is decreased.

As will be understood from the foregoing description, the cut-off circuits effectively prevents the static type random access memory device from excessive current consumption in the standby phase, and the production yield is improved.

Although particular embodiments of the present invention have been shown and described, it will be obvious to those skilled in the art that various changes and modifications may be made without departing from the spirit and scope of the present invention.

What is claimed is:

1. A semiconductor memory device fabricated on a single semiconductor memory chip, comprising:
   a) a regular memory cell array having a plurality of regular memory cells arranged in rows and columns and respectively storing data bits;
   b) a plurality of first power voltage lines associated with said rows of said memory cells for distributing a first powder voltage level;
   c) a plurality of second powder voltage lines associated with said rows of said memory cells for distributing a second power voltage level different from said first power voltage level;
   d) a plurality of regular word lines respectively associated with said rows of said regular memory cells, and selectively driven to an active level for allowing data bits to be read out from a row of said regular memory cells;
   e) a redundant memory cell array arranged in rows and columns, having a plurality of redundant memory cells respectively storing data bits, and coupled with redundant word lines;
   f) a redundant word line driving unit selectively driving said redundant word lines to said active level for allowing data bits to be read out from redundant memory cells selected from said plurality of redundant memory cells when one of said plurality of regular memory cells to be accessed is defective;
   g) a row address decoding means having g-1) a plurality of regular driver circuits respectively associated with said regular word lines and coupled in parallel between a first source line of said active level and a second source line of an inactive level for selectively coupling said associated regular word lines with said first and second source lines, g-2) a plurality of activation circuits associated with said plurality of regular word lines and responsive to row address bits for allowing said regular driver circuits to selectively couple the associated regular word lines to said first and second source lines, and g-3) a plurality of first cut-off means associated with said plurality of activation circuits and with said first power voltage lines, and coupled between a main power supply line and said associated first power voltage lines, said plurality of first cut-off means being selectively broken for isolating said associated first power voltage lines from said main power supply line when one of said regular memory cells in said associated rows is defective, said plurality of activation circuits causing the associated regular driver circuits to forcibly shift said associated regular word lines to said inactive level when said associated first cut-off means are broken; and
   h) a plurality of bit line pairs associated with said regular memory cell array and said redundant memory cell array, and shared between said columns of said regular memory cells and said columns of said redundant memory cells for propagating data bits to a column selector unit; wherein
   each of said regular memory cells and said redundant memory cells is implemented by a flip flop circuit coupled between said associated first and second power voltage lines, said flip flop circuit comprising a series combination of a first resistor and a first transistor of a first channel conductivity type coupled between said associated first and second power voltage lines, a series combination of a second resistor and a second transistor of said first channel conductivity type coupled between said associated first and second power voltage lines, and a pair of third transistors coupled between the drain nodes of said first and second transistors and said associated bit line pair and gated by one of said plurality of regular word lines or by one of said redundant word lines, said first and second transistors being gated by said drain nodes of said second and first transistors, respectively;
   each of said plurality of activation circuits comprises a plurality of fourth transistors of a second channel conductivity type and a fifth transistor of said second channel conductivity type coupled in parallel between a third source line of power voltage level and a control line and respectively gated by row address bits selected from said row address bits, and a plurality of sixth transistors of said first channel conductivity type and a seventh transistor of said first channel conductivity type coupled in series between said control line and a fourth source line of power voltage level different from said third source line and respectively gated by said selected row address bits, said fifth and seventh transistors being gated by said associated first power voltage line;
   each of said plurality of regular driving circuits comprises a series combination of an eighth transistor of said second channel conductivity type and a ninth transistor of said second channel conductivity type coupled between said first source line and said associated regular word line, a parallel combination of a tenth transistor of said first channel conductivity type and an eleventh transistor of said first channel conductivity type coupled between said associated regular word line and said second source line, said eighth and eleventh transistors being gated by one of a row address bit selected from said row address bits and a complementary row address bit thereof, said ninth and tenth transistors being gated by said control line; and each of said plurality of first cut-off means comprises a first fuse element coupled between said main power line and said associated first power voltage line, and a third resistor coupled between said associated first power voltage line and said second power voltage line.

2. A semiconductor memory device as set forth in claim 1, in which said third resistor is as large in resistance as about 10 giga-ohms.

3. A semiconductor memory device fabricated on a single semiconductor memory chip, comprising:
   a) a regular memory cell array having a plurality of regular memory cells arranged in rows and columns and respectively storing data bits;
   b) a plurality of first power voltage lines associated with said rows of said memory cells for distributing a first power voltage level;
   c) a plurality of second power voltage lines associated with said rows of said memory cells for distributing a second power voltage level different from said first power voltage level;
   d) a plurality of regular word lines respectively associated with said rows of said regular memory cells, and selectively driven to an active level for allowing data bits to be read out from a row of said regular memory cells;
   e) a redundant memory cell array arranged in rows and columns, having a plurality of redundant memory cells respectively storing data bits, and coupled with redundant word lines;
   f) a redundant word line driving unit selectively driving said redundant word lines to said active level for allowing data bits to be read out from redundant memory cells selected from said plurality of redundant memory cells when one of said plurality of regular memory cells to be accessed is defective;
   g) a row address decoding means having g-1) a plurality of regular driver circuits respectively associated with said regular word lines and coupled in parallel between a first source line of said active level and a second source line of an inactive level for selectively coupling said associated regular word lines with said first and second source lines, g-2) a plurality of activation circuits associated with said plurality of regular word lines and responsive to row address bits for allowing said regular driver circuits to selectively couple the associated regular word lines to said first and second source lines, each of said plurality of activation circuits comprising a plurality of fourth transistors of a second channel conductivity type and a fifth transistor of said second channel conductivity type coupled in parallel between a third source line of power voltage level and a control line and respectively gated by row address bits selected from said row address bits, and a plurality of sixth transistors of said first channel conductivity type and a seventh transistor of said first channel conductivity type coupled in series between said control line and a fourth source line of power voltage level different from said third source line and respectively gated by said selected row address bits, said fifth and seventh transistors being gated by said associated first power voltage line, and g-3) a plurality of first cut-off means associated with said plurality of activation circuits and with said first power voltage lines, and coupled between a main power supply line and said associated first power voltage lines, said plurality of first cut-off means being selectively broken for isolating said associated first power voltage lines from said main power supply line when one of said regular memory cells in said associated rows is defective, said plurality of activation circuits causing the associated regular driver circuits to forcibly shift said associated regular word lines to said inactive level when said associated first cut-off means are broken;
   h) a plurality of bit line pairs associated with said regular memory cell array and said redundant memory cell array, and shared between said columns of said regular memory cells and said columns of said redundant memory cells for propagating data bits to a column selector unit; wherein
   each of said regular memory cells and said redundant memory cells is implemented by a flip flop circuit coupled between said associated first and second power voltage lines, said flip flop circuit comprising a series combination of a first resistor and a first transistor of said first channel conductivity type coupled between said associated first and second voltage lines, a series combination of a second resistor and a second transistor of said first channel conductivity type coupled between said associated first and second power voltage lines, and a pair of third transistors coupled between the drain nodes of said first and second transistors and said associated bit line pair and gated by one of said plurality of regular word lines or by one of said redundant word lines, said first and second transistors being gated by said drain nodes of said second and first transistor, respectively;
   i) a charging unit responsive to a control signal for coupling said plurality of bit line pairs with a fifth source line of power voltage and for equalizing component bit lines of each of said plurality of bit line pairs;
   j) a redundant bit line pair coupled between said charging unit and said column selecting unit;
   k) additional regular memory cells coupled with said redundant bit line pair and gated by said regular word lines, respectively;
   l) additional redundant memory cells coupled with said redundant bit line pair and gated by said redundant word lines, respectively; and
   m) a column address decoding unit responsive to column address bits for allowing said column selecting unit to couple one of said plurality of bit line pairs with a data bus in so far as plurality of bit line pairs with a data bus in so far as said plurality of bit line pairs are used, said column selecting unit being further operative to couple said redundant bit line pair with said data bus when one of said plurality of bit line pairs replaced with said redundant bit line pair is designated by said column address bits, said column address decoding unit being further operative to isolate said data bus from said plurality of bit line pairs when said one of said plurality of bit line pairs replaced with said redundant bit line pair is designed by said column address bits, said column address decoding unit comprising m-1) a plurality of second driver circuits respectively associated with said plurality of bit line pairs, and responsive to said column address bits for allowing said column selecting unit to couple one of said bit line pairs with said data bus, m-2) a plurality of first charging circuits respectively supplying current from said fifth source line to said bit line pairs, m-3) a second charging circuit supplying current from said fifth source line to said redundant bit line pair, and m-4) a second cut-off means operative of cut off said one of said plurality of bit line pairs replaced with said redundant bit line pair from said current supplied from one of said plurality of first charging circuits and to cause one of said second driver circuits associated with said one of said plurality of bit line pairs replaced with said redundant bit line pair to be not responsive to said column address bits.

4. A semiconductor memory device as set forth in claim 3, in which each of said first charging circuits is implemented by a pair of eighth transistors of said second channel conductivity type opposite to said first channel conductivity type coupled between said fifth source line and one of said plurality of bit line pairs, and in which said second cut-off means has a second fuse element associated with said each of said first charging circuits and coupled between the gate electrodes of said eighth transistors and a sixth source line of power voltage level different from said fifth source line, and a third resistor coupled between said fifth source line and said gate electrodes of said eighth transistors, the voltage level at said gate electrodes of said eighth transistors enabling or disenabling one of said plurality of driver circuits.

5. A semiconductor memory device as set forth in claim 4, in which said third resistor is as large in resistance as 10 giga-ohms.

6. A semiconductor memory device as set forth in claim 4, in which said one of said second driver circuits associated with said second fuse element and said third resistor is provided for bit line pairs selected from said plurality of bit line pairs.

* * * * *